US009887210B2

(12) United States Patent
Song et al.

(10) Patent No.: US 9,887,210 B2
(45) Date of Patent: *Feb. 6, 2018

(54) SEMICONDUCTOR DEVICE

(71) Applicant: SAMSUNG ELECTRONICS CO., LTD., Suwon-si (KR)

(72) Inventors: Taejoong Song, Seongnam-si (KR); Ha-Young Kim, Seoul (KR); Jung-Ho Do, Yongin-si (KR); Sanghoon Baek, Seoul (KR); Jinyoung Lim, Seoul (KR); Kwangok Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/238,912

(22) Filed: Aug. 17, 2016

(65) Prior Publication Data
US 2017/0062403 A1 Mar. 2, 2017

(30) Foreign Application Priority Data

Aug. 28, 2015 (KR) .................. 10-2015-0121920
Nov. 19, 2015 (KR) .................. 10-2015-0162674

(51) Int. Cl.
*H01L 21/76* (2006.01)
*H01L 27/118* (2006.01)
(Continued)

(52) U.S. Cl.
CPC .......... *H01L 27/11807* (2013.01); *G03F 1/36* (2013.01); *G06F 17/505* (2013.01);
(Continued)

(58) Field of Classification Search
CPC ....... H01L 27/11807; H01L 21/823821; H01L 21/823878; H01L 27/0924; H01L 22/20;
(Continued)

(56) References Cited

U.S. PATENT DOCUMENTS 7,321,139 B2   1/2008   Chang et al.
7,600,207 B2  10/2009   Moroz et al.
(Continued)

OTHER PUBLICATIONS

Office Action dated Nov. 24, 2017 by the United States Patent and Trademark Office in U.S. Appl. No. 15/282,206.

*Primary Examiner* — Bitew Dinke
(74) *Attorney, Agent, or Firm* — Sughrue Mion, PLLC

(57) ABSTRACT

A semiconductor device includes a substrate including a first active region and a second active region, the first active region having a conductivity type that is different than a conductivity type of the second active region, and the first active region being spaced apart from the second active region in a first direction, gate electrodes extending in the first direction, the gate electrodes intersecting the first active region and the second active region, a first shallow isolation pattern disposed in an upper portion of the first active region, the first shallow isolation pattern extending in the first direction, and a deep isolation pattern disposed in an upper portion of the second active region, the deep isolation pattern extending in the first direction, and the deep isolation pattern dividing the second active region into a first region and a second region.

13 Claims, 14 Drawing Sheets

(51) Int. Cl.
*G06F 17/50* (2006.01)
*G03F 1/36* (2012.01)
*H01L 21/8238* (2006.01)
*H01L 21/66* (2006.01)
*H01L 27/02* (2006.01)
*H01L 27/092* (2006.01)

(52) U.S. Cl.
CPC ...... *G06F 17/5045* (2013.01); *G06F 17/5077* (2013.01); *G06F 17/5081* (2013.01); *H01L 21/823821* (2013.01); *H01L 21/823878* (2013.01); *H01L 22/20* (2013.01); *H01L 27/0207* (2013.01); *H01L 27/0924* (2013.01); *H01L 2027/11831* (2013.01); *H01L 2027/11881* (2013.01)

(58) Field of Classification Search
CPC ......... H01L 27/0207; H01L 21/823431; H01L 21/845; H01L 21/76; H01L 21/823481; H01L 29/0642; G06F 17/5045; G06F 17/505; G06F 17/5077; G06F 17/5081; G03F 1/36
See application file for complete search history.

(56) References Cited

U.S. PATENT DOCUMENTS

| | | |
|---|---|---|
| 8,527,933 B2 | 9/2013 | Sharma |
| 8,561,003 B2 | 10/2013 | Kawa et al. |
| 8,686,512 B2 | 4/2014 | Moroz et al. |
| 8,759,885 B1 | 6/2014 | Jain et al. |
| 8,869,089 B2 | 10/2014 | Baek et al. |
| 8,901,615 B2 | 12/2014 | Moroz |
| 2007/0204250 A1 | 8/2007 | Moroz et al. |
| 2007/0284618 A1 | 12/2007 | Chang et al. |
| 2011/0309453 A1 | 12/2011 | Moroz et al. |
| 2013/0026571 A1* | 1/2013 | Kawa ................ H01L 27/0207 257/347 |
| 2013/0074026 A1 | 3/2013 | Sharma |
| 2013/0224936 A1* | 8/2013 | Lee ................ H01L 21/823821 438/492 |
| 2013/0263077 A1 | 10/2013 | Baek et al. |
| 2013/0334613 A1 | 12/2013 | Moroz et al. |
| 2014/0048889 A1 | 2/2014 | Bitterlich |
| 2014/0227857 A1* | 8/2014 | Youn ................ H01L 21/76229 438/427 |
| 2014/0374828 A1* | 12/2014 | Song ................ H01L 27/10826 257/347 |
| 2015/0054078 A1 | 2/2015 | Xie et al. |
| 2015/0084097 A1* | 3/2015 | Jeon ................ H01L 27/11807 257/206 |
| 2015/0102413 A1* | 4/2015 | Azmat ............. H01L 27/11807 257/365 |
| 2015/0194427 A1 | 7/2015 | Sengupta et al. |
| 2016/0056083 A1* | 2/2016 | Do ................ H01L 21/823431 438/299 |
| 2016/0056153 A1* | 2/2016 | Do .................... H01L 27/11807 257/390 |
| 2016/0056155 A1* | 2/2016 | Park ................ H01L 29/0847 257/401 |
| 2016/0056231 A1* | 2/2016 | Singh ................ H01L 29/0619 257/487 |
| 2016/0071962 A1* | 3/2016 | Senapati ............... H01L 29/735 257/48 |
| 2016/0079241 A1* | 3/2016 | Kim .................... H01L 27/0886 257/401 |
| 2016/0079354 A1* | 3/2016 | Park .................... H01L 27/0886 257/386 |
| 2016/0118473 A1* | 4/2016 | Singh .................... H01L 29/785 257/484 |
| 2016/0247728 A1* | 8/2016 | You ................ H01L 21/823821 |
| 2016/0254256 A1* | 9/2016 | Baek .................. H01L 27/0207 257/401 |
| 2016/0284695 A1* | 9/2016 | Liaw ................ H01L 27/088 |
| 2016/0284799 A1* | 9/2016 | Yoon ................ H01L 29/0653 |
| 2016/0300766 A1* | 10/2016 | Kim ................ H01L 21/823475 |
| 2016/0351458 A1* | 12/2016 | Wang ............... H01L 29/66537 |
| 2017/0032074 A1* | 2/2017 | Song ................ H01L 21/76877 |
| 2017/0062475 A1* | 3/2017 | Song ................ H01L 27/11807 |
| 2017/0077034 A1* | 3/2017 | Song ................ H01L 27/088 |
| 2017/0148727 A1* | 5/2017 | Do ........................ H01L 23/528 |
| 2017/0154976 A1* | 6/2017 | Oh ...................... H01L 29/6681 |

* cited by examiner

SEMICONDUCTOR DEVICE

CROSS-REFERENCE TO RELATED APPLICATIONS

This application claims priority from Korean Patent Application No. 10-2015-0121920, filed on Aug. 28, 2015, and Korean Patent Application No. 10-2015-0162674, filed on Nov. 19, 2015, in the Korean Intellectual Property Office, the disclosures of which are incorporated herein by reference in their entireties.

BACKGROUND

Apparatuses consistent with example embodiments relate to a semiconductor device and, more particularly, to a semiconductor device including a field effect transistor.

Semiconductor devices are widely used in the electronics industry because of their small sizes, multi-functional characteristics, and/or low manufacture costs. Semiconductor devices are categorized as any one among semiconductor memory devices for storing logical data, semiconductor logic devices for processing logical data, and hybrid semiconductor devices having both the function of the semiconductor memory devices and the function of the semiconductor logic devices. Semiconductor devices with excellent characteristics are in demand with the development of the electronics industry. For example, highly-reliable, high-speed, and/or multi-functional semiconductor devices are increasingly in demand. To satisfy these demands, semiconductor devices are designed to be structurally complicated and highly integrated.

SUMMARY

Example embodiments provide a semiconductor device including a field effect transistor with improved electrical characteristics.

According to an aspect of an example embodiment, there is provided a semiconductor device including a substrate including a first active region and a second active region, the first active region having a conductivity type that is different than a conductivity type of the second active region, and the first active region being spaced apart from the second active region in a first direction, and gate electrodes extending in the first direction, the gate electrodes intersecting the first active region and the second active region. The semiconductor device further includes a first shallow isolation pattern disposed in an upper portion of the first active region, the first shallow isolation pattern extending in the first direction, and a deep isolation pattern disposed in an upper portion of the second active region, the deep isolation pattern extending in the first direction, and the deep isolation pattern dividing the second active region into a first region and a second region. The first shallow isolation pattern is aligned with the deep isolation pattern in the first direction.

The semiconductor device may further include first active patterns disposed on the substrate in the first active region, the first active patterns extending in a second direction intersecting the first direction, and second active patterns disposed on the substrate in the second active region, the second active patterns extending in the second direction.

The semiconductor device may further include a second shallow isolation pattern disposed in the upper portion of the first active region, the second shallow isolation pattern extending in the first direction. A sidewall of the first shallow isolation pattern may be aligned with a first sidewall of the deep isolation pattern in the first direction, and a sidewall of the second shallow isolation pattern may be aligned with a second sidewall of the deep isolation pattern in the first direction.

The first active region may include a local area disposed between the first shallow isolation pattern and the second shallow isolation pattern.

The semiconductor device may further include a second shallow isolation pattern disposed in the upper portion of the first active region and an upper portion of the first region of the second active region, the second shallow isolation pattern extending in the first direction. The first active region may include a first local area disposed between the first shallow isolation pattern and the second shallow isolation pattern, and the first region of the second active region may include a second local area disposed between the second shallow isolation pattern and the deep isolation pattern.

At least one among the gate electrodes may intersect the first local area and a top surface of the deep isolation pattern.

A sidewall of the first shallow isolation pattern may be aligned with a sidewall of the deep isolation pattern in the first direction.

A width of the deep isolation pattern may be greater than a width of the first shallow isolation pattern, and a depth of the deep isolation pattern may be deeper than a depth of the first shallow isolation pattern.

The first shallow isolation pattern and the deep isolation pattern may be disposed at a boundary between a first standard cell and a second standard adjacent to the first standard cell to isolate the first standard cell from the second standard cell.

At least two of the gate electrodes may intersect a top surface of the deep isolation pattern.

According to an aspect of another example embodiment, there is provided a semiconductor device including a substrate, first active patterns disposed on the substrate, the first active patterns extending in a first direction, and second active patterns disposed on the substrate, the second active patterns extending in the first direction in parallel to the first active patterns, and the first active patterns having a conductivity type that is different than a conductivity type of the second active patterns. The semiconductor device further includes gate electrodes intersecting the first active patterns and the second active patterns, the gate electrodes extending in a second direction intersecting the first direction, and an isolation structure disposed at a boundary between a first standard cell and a second standard adjacent to the first standard cell, the isolation structure isolating the first standard cell from the second standard cell. The isolation structure includes a first shallow isolation pattern disposed in the substrate and between the first active patterns, and a deep isolation pattern disposed in the substrate and between the second active patterns.

One among the gate electrodes may be disposed on the first shallow isolation pattern and the deep isolation pattern.

The isolation structure may further include a second shallow isolation pattern disposed between the first active patterns. A sidewall of the first shallow isolation pattern may be aligned with a first sidewall of the deep isolation pattern in the second direction, and a sidewall of the second shallow isolation pattern may be aligned with a second sidewall of the deep isolation pattern in the second direction.

The substrate may include a local area disposed between the first shallow isolation pattern and the second shallow isolation pattern, and the first active patterns may intersect the local area.

The isolation structure may further include a second shallow isolation pattern disposed between the first active patterns and the second active patterns, the second shallow isolation pattern being spaced apart from the deep isolation pattern in the first direction.

The substrate may include a first local area disposed between the first shallow isolation pattern and the second shallow isolation pattern, and a second local area disposed between the second shallow isolation pattern and the deep isolation pattern, the first active patterns may intersect the first local area, and the second active patterns may intersect the second local area.

According to an aspect of another example embodiment, there is provided a semiconductor device including a substrate, first active patterns disposed on the substrate, the first active patterns extending in a first direction, and second active patterns disposed on the substrate, the second active patterns extending in the first direction, and the first active patterns having a conductivity type that is different than a conductivity type of the second active patterns. The semiconductor device further includes a first isolation pattern disposed in the substrate and between the first active patterns, the first isolation pattern extending in a second direction intersecting the first direction, a second isolation pattern disposed in the substrate and between the second active patterns, the second isolation pattern extending in the second direction, and the second isolation pattern having a depth and a width that are greater than a depth and a width of the first isolation pattern, and a first gate electrode disposed on the first isolation pattern and the second isolation pattern, the second gate electrode extending in the second direction.

The semiconductor device may further include a second gate electrode disposed on the first active patterns and the second active patterns, the second gate electrode extending in the second direction.

The first isolation pattern may further include a first portion including a sidewall aligned with a first sidewall of the second isolation pattern, and a second portion including a sidewall aligned with a second sidewall of the second isolation pattern, and the substrate may include a local area disposed between the first portion and the second portion, the local area being on which the first active patterns are disposed.

The first isolation pattern may include a first portion including a sidewall aligned with a sidewall of the second isolation pattern, and a second portion disposed between the first active patterns and the second active patterns, the substrate may include a first local area disposed between the first portion and the second portion, and a second local area disposed between the second portion and the second isolation pattern, the first local area being on which the first active patterns and a second gate electrode are disposed, and the second local area being on which the second active patterns are disposed, and the second gate electrode may be extending from the first local area to the second isolation pattern in the second direction.

BRIEF DESCRIPTION OF THE DRAWINGS

The above and/or other aspects will be more apparent by describing exemplary embodiments with reference to the accompanying drawings.

DETAILED DESCRIPTION

Figure 1:
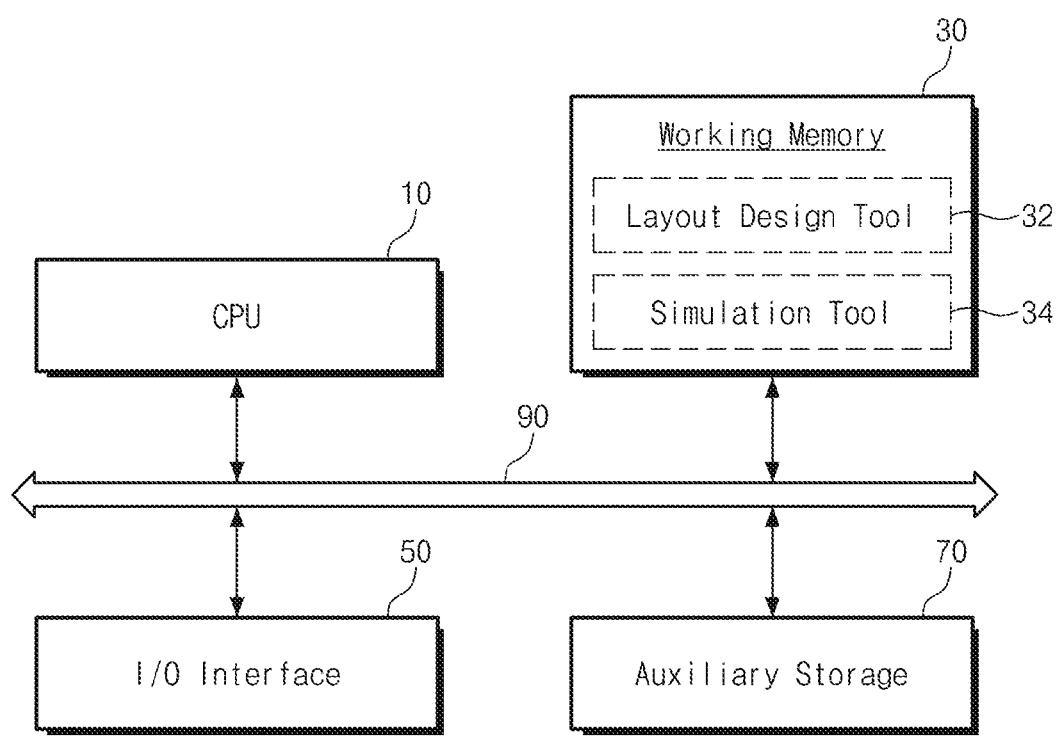
FIG. 1 is a block diagram illustrating a computer system for performing a semiconductor design process, according to an example embodiment.

Example embodiments will now be described more fully hereinafter with reference to the accompanying drawings, in which the example embodiments are shown. The example embodiments and methods of achieving them will be described in more detail with reference to the accompanying drawings. The example embodiments may, however, be embodied in different forms and may not be constructed as limited to the example embodiments set forth herein. Rather, these example embodiments are provided so that this disclosure will be thorough and complete, and will fully convey the scope of the example embodiments to those skilled in the art.

As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the example embodiments in the detailed description will be described with sectional views as ideal views. Accordingly, shapes of the views may be modified according to manufacturing techniques and/or allowable errors. Therefore, the example embodiments are not limited to the shape illustrated in the views, but may include other shapes that may be created according to manufacturing processes.

The example embodiments explained and illustrated herein include their complementary counterparts. The same reference numerals or the same reference designators denote the same elements throughout the specification.

FIG. 1 is a block diagram illustrating a computer system for performing a semiconductor design process, according to example embodiments. Referring to FIG. 1, the computer system includes a central processing unit (CPU) 10, a working memory 30, an input/output (I/O) interface 50, and an auxiliary storage 70. The computer system may be provided in the form of a customized system for performing a layout design process according to example embodiments. Furthermore, the computer system may be configured to execute various design and verification simulation programs.

The CPU 10 may run a variety of software (e.g., an application program, an operating system, and/or device drivers) in the computer system. For example, the CPU 10 may run an operating system loaded in the working memory 30. Further, the CPU 10 may run various application programs based on the operating system. For example, the CPU 10 may run a layout design tool 32 loaded in the working memory 30.

The operating system or application programs may be loaded in the working memory 30. For example, when the computer system is booted up, an OS image stored in the storage 70 may be loaded in the working memory 30 based on a booting sequence. In the computer system, overall input/output operations may be managed by the operating system. Similarly, some application programs, which may be selected by a user or be provided for basic services, may be loaded in the working memory 30. According to example embodiments, the layout design tool 32 prepared for a layout design process may be loaded in the working memory 30, from the storage 70.

The layout design tool 32 may include a biasing function for changing shapes and positions, defined by a design rule, of layout patterns. In other words, the shapes and positions of the layout patterns changed by the biasing function may be different from those defined by the design rule. The layout design tool 32 may perform a design rule check (DRC) under the changed biasing data. The working memory 30 may include at least one among a volatile memory device (e.g., a static random access memory (SRAM) device or a dynamic random access memory (DRAM) device) or a non-volatile memory device (e.g., a phase-change RAM (PRAM) device, a magnetoresistive RAM (MRAM) device, a resistive RAM (ReRAM) device, a ferroelectric RAM (FRAM) device, or a NOR FLASH memory device).

In addition, a simulation tool 34 may be loaded in the working memory 30 to perform an optical proximity correction (OPC) operation on the designed layout data.

The I/O interface 50 may control user input and output operations of user interfaces. For example, the I/O interface 50 may include a keyboard or a monitor, allowing a designer to input relevant information. By using the input-output interface 50, the designer may receive information of a semiconductor region or data paths having adjusted operating characteristics. The I/O interface 50 may display a progress status or a process result of the simulation tool 34.

The storage 70 may serve as a storage medium for the computer system. The storage 70 may store the application programs, the OS image, and various data. The storage 70 may be provided in the form of one among memory cards (e.g., MultiMediaCard (MMC), embedded MCC (eMMC), Secure Digital (SD), Micro SD, and so forth) or a hard disk drive (HDD). The storage 70 may include a NAND flash memory device with a large memory capacity. Alternatively, the storage 70 may include at least one among a next-generation nonvolatile memory device (e.g., a PRAM device, a MRAM device, a ReRAM device, or a FRAM device) or a NOR FLASH memory device.

A system interconnector 90 may be provided to serve as a system bus for realizing a network in the computer system. The CPU 10, the working memory 30, the I/O interface 50, and the storage 70 may be electrically connected to each other through the system interconnector 90 and may exchange data with each other. However, the system interconnector 90 may not be limited to the above descriptions. In example embodiments, the system interconnector 90 may further include an additional element for increasing efficiency in data communication.

Figure 2:
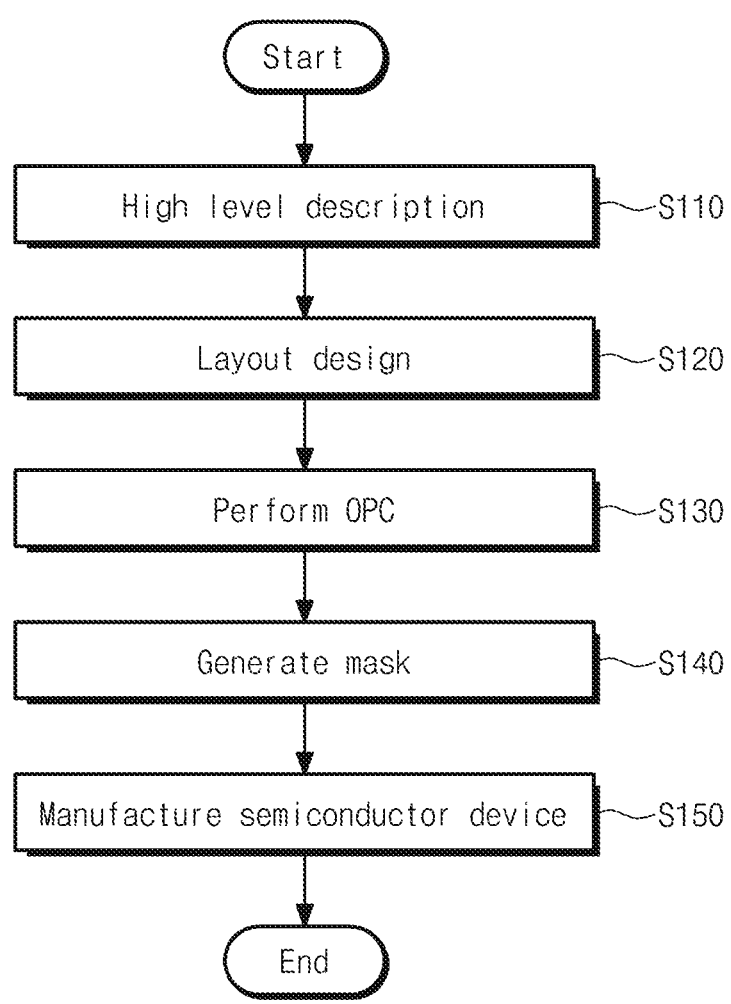
FIG. 2 is a flow chart illustrating a method of designing and manufacturing a semiconductor device, according to an example embodiment.

FIG. 2 is a flow chart illustrating a method of designing and manufacturing a semiconductor device, according to example embodiments.

Referring to FIG. 2, a high level description design process of a semiconductor integrated circuit is performed using the computer system of FIG. 1 (S110). The high level design process may mean that an integrated circuit corresponding to a design target is described with a high level language of a hardware description language (HDL). For example, the high level language such as C language may be used in the high level design process. Circuits designed by the high level design process may be expressed using a register transfer level (RTL) coding and a simulation. In addition, codes generated by the RTL coding may be converted into a netlist, and the netlist may be synthesized to describe an entire semiconductor device. The synthesized schematic circuit may be verified by a simulation tool, and an adjustment process may be performed based on the verified result.

A layout design process is performed to realize a logically completed semiconductor integrated circuit on a silicon substrate (S120). For example, the layout design process may be performed based on the schematic circuit synthesized in the high level design process or the netlist corresponding to the schematic circuit. The layout design process may include a routing process of placing and connecting various standard cells provided from a cell library, based on a prescribed design rule. In the layout design process according to example embodiments, a diffusion barrier pattern having suitable electrical characteristics may be introduced to a boundary of at least one standard cell. A standard cell redesigned like this may be provided to the cell library.

The cell library may contain information on operation, speed, and power consumption of the standard cells. In example embodiments, a cell library for representing a layout of a circuit in a gate level may be defined in the layout design tool. Here, the layout may be prepared to define or describe shapes, positions, or dimensions of patterns constituting transistors and metal lines, which will be actually formed on a silicon substrate. For example, to actually form an inverter circuit on a silicon substrate, layout patterns (e.g., p-channel metal-oxide-semiconductor (PMOS), n-channel metal-oxide-semiconductor (NMOS), N-WELL, gate electrodes, and metal lines thereon) may be suitable placed or drawn. For this, suitable one(s) of inverters defined previously in the cell library may be searched and selected. Thereafter, a routing process may be performed on the selected and placed standard cells. These processes may be automatically or manually performed in the layout design tool. In example embodiments, processes of placing and routing the standard cells may be automatically performed by an additional place & routing tool.

After the routing process, a verification process may be performed on the layout to verify whether there is a portion violating the design rule. In example embodiments, the verification process may include a DRC for verifying whether the layout meets the design rule, an electrical rule check (ERC) for verifying whether there is an issue of electrical disconnection in the layout, and a layout vs schematic (LVS) for recognizing whether the layout is prepared to coincide with the gate-level netlist.

An OPC process is performed (S130). The layout patterns obtained by the layout design process may be projected on a silicon substrate by a photolithography process. At this time, the OPC process may be a technique for correcting an optical proximity effect occurring in the photolithography process. In other word, the OPC process may correct the optical proximity effect that may occur by refraction or diffraction of light and/or a process side effect in an exposure process using the layout patterns. The shapes and positions of the designed layout patterns may be slightly changed by the OPC process.

At least one photomask is generated or manufactured based on the layout changed by the OPC process (S140). The photomask may be manufactured by patterning a chromium layer provided on a glass substrate on the basis of the data of the layout patterns.

A semiconductor device is manufactured using the manufactured photomasks (S150). Various exposure processes and various etching processes may be repeatedly performed in processes of manufacturing the semiconductor device, and thus, the patterns defined by the layout design process may be sequentially formed on a silicon substrate.

Figure 3:
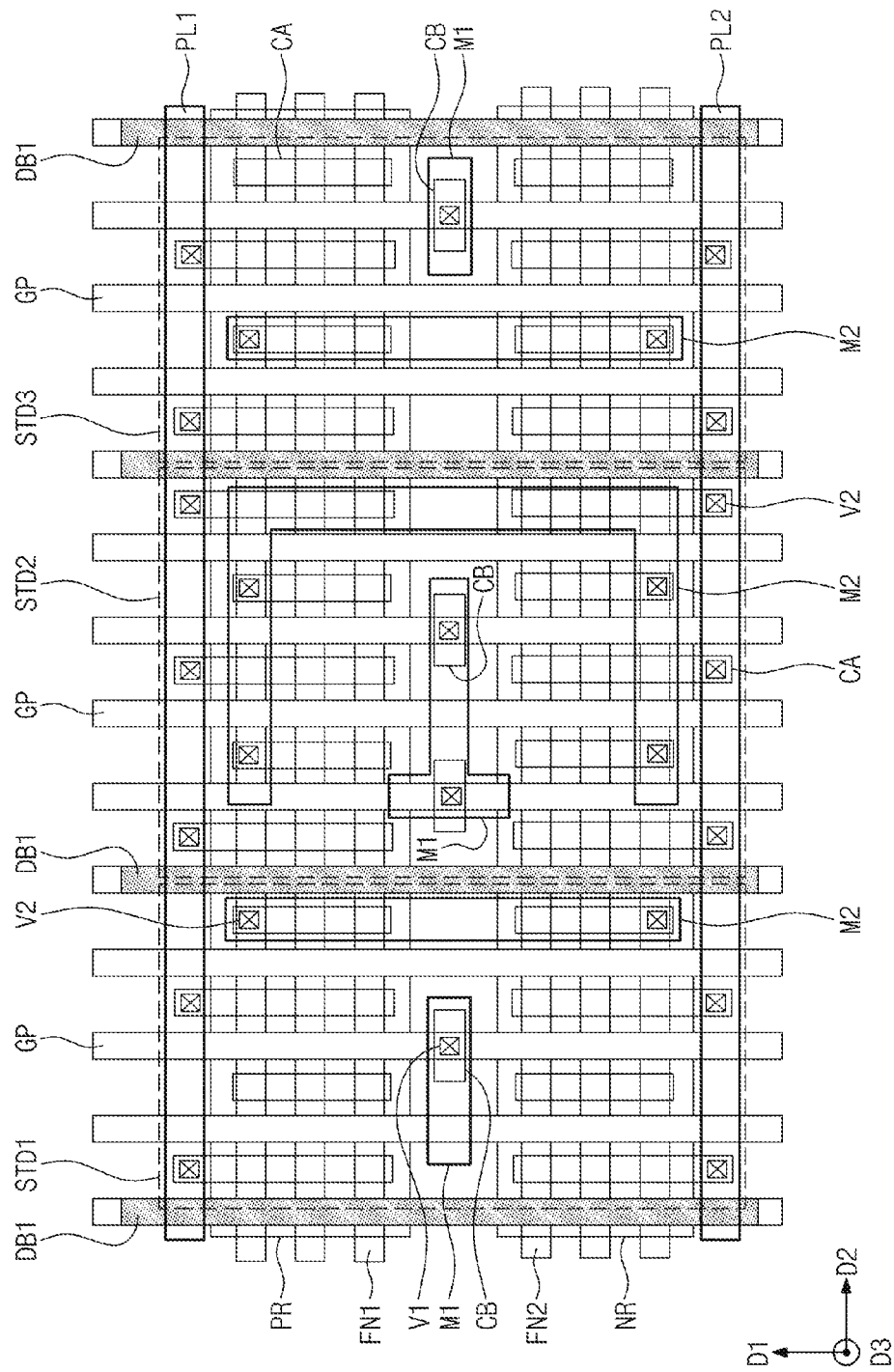
FIG. 3 is a plan view illustrating arranged standard cell layouts.

FIG. 3 is a plan view illustrating arranged standard cell layouts.

Referring to FIG. 3, standard cell layouts may be arranged in parallel by a layout design tool. In example embodiments, the standard cell layouts includes first, second, and the third standard cell layouts STD1, STD2, and STD3. The first to third standard cell layouts STD1 to STD3 are arranged in a second direction D2. Each of the first to third standard cell layouts STD1 to STD3 may include a logic layout defining logic transistors and an interconnection layout disposed on the logic layout.

The logic layout may include layout patterns defining active regions. The active regions include a PMOSFET region PR and an NMOSFET region NR. The PMOSFET region PR and the NMOSFET region NR are spaced apart from each other in a first direction D1 intersecting the second direction D2.

A plurality of first active patterns FN1 extending in the second direction D2 are disposed on the PMOSFET region PR. The first active patterns FN1 are spaced apart from each other in the first direction D1. A plurality of second active patterns FN2 extending in the second direction D2 are disposed on the NMOSFET region NR. The second active patterns FN2 are spaced apart from each other in the first direction D1.

The logic layout further includes gate patterns GP that extend in the first direction D1 to intersect the PMOSFET region PR and the NMOSFET region NR. The gate patterns GP are spaced apart from each other in the second direction D2. The PMOSFET region PR, the NMOSFET region NR, and the gate patterns GP may constitute the logic transistors.

In addition, the logic layout further includes active contact patterns CA connected to each of the PMOSFET region PR and the NMOSFET region NR, and gate contact patterns CB connected to the gate patterns GP.

The interconnection layout includes first and second power patterns PL1 and PL2 and first and second interconnection patterns M1 and M2. The first and second power patterns PL1 and PL2 have liner shapes extending in the second direction D2. The first and second power patterns PL1 and PL2 are connected to some of the active contact patterns CA through second via patterns V2. The first interconnection patterns M1 are connected to the gate contact patterns CB through first via patterns V1. The second interconnection patterns M2 are connected to some of the active contact patterns CA through the second via patterns V2.

A single diffusion barrier pattern DB1 is disposed at a boundary of each of the first to third standard cell layouts STD1, STD2, and STD3. The single diffusion barrier pattern DB1 extends in the first direction D1 to intersect the PMOSFET region PR and the NMOSFET region NR. The single diffusion barrier patterns DB1 may overlap with some of the gate patterns GP.

The single diffusion barrier patterns DB1 may prevent movement and diffusion of carriers between among the active regions of the first to third standard cell layouts STD1 to STD3 to electrically insulate the active regions of the first to third standard cell layouts STD1 to STD3 from each other. For example, the single diffusion barrier pattern DB1 between the first and second standard cell layouts STD1 and STD2 may electrically insulate the PMOSFET region PR of the first standard cell layout STD1 and the PMOSFET region PR of the second standard cell layout STD2 from each other. In addition, the single diffusion barrier pattern DB1 between the first and second standard cell layouts STD1 and STD2 may electrically insulate the NMOSFET region NR of the first standard cell layout STD1 and the NMOSFET region NR of the second standard cell layout STD2 from each other.

Meanwhile, different influences from each other may be applied to electrical characteristics of the PMOSFET region PR and the NMOSFET region NR, according to a kind of the diffusion barrier pattern disposed at the boundary of the standard cell layouts. Thus, unlike the single diffusion barrier patterns DB1 uniformly arranged in FIG. 3, a single diffusion barrier pattern may be prepared to be suitable to each of the PMOSFET region PR and the NMOSFET region NR based on a semiconductor device to be designed. Thus, performance of the semiconductor device may be improved.

Figure 4:
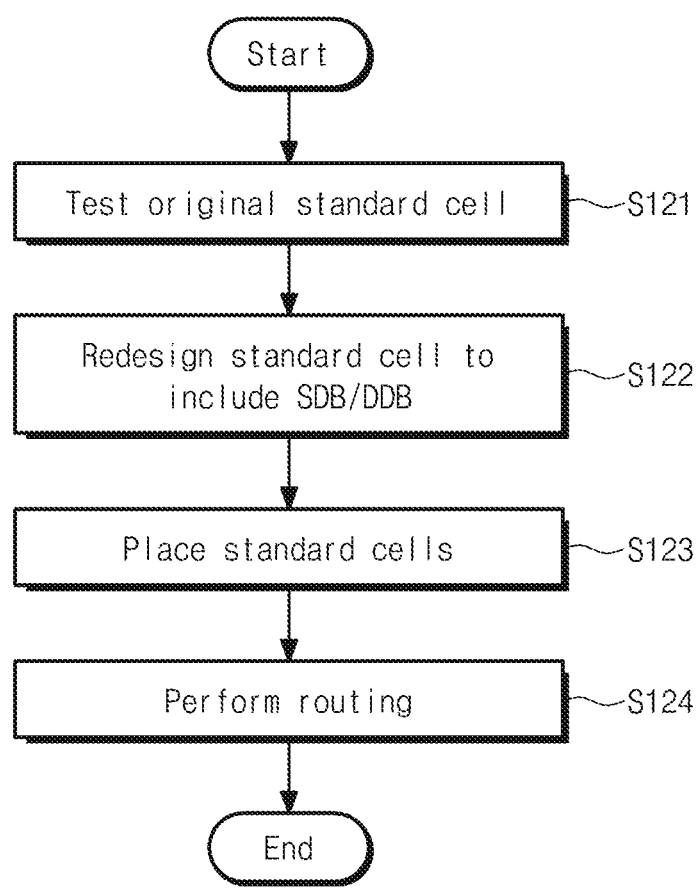
FIG. 4 is a flow chart illustrating a method of designing a layout of FIG. 3, according to an exemplary embodiment.
Figure 5A:
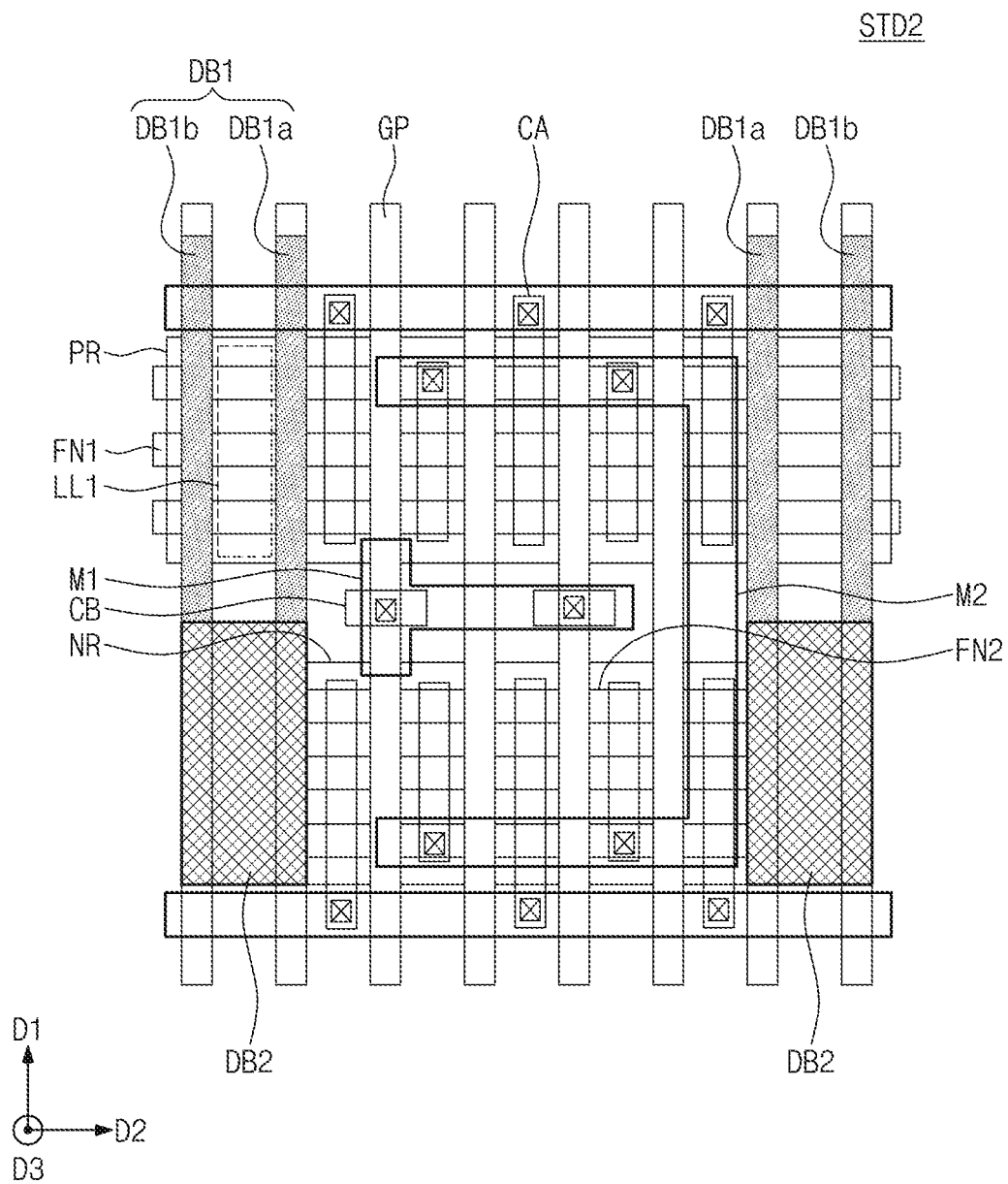
FIG. 5A is a plan view illustrating a standard cell layout redesigned according to an exemplary embodiment.
Figure 5B:
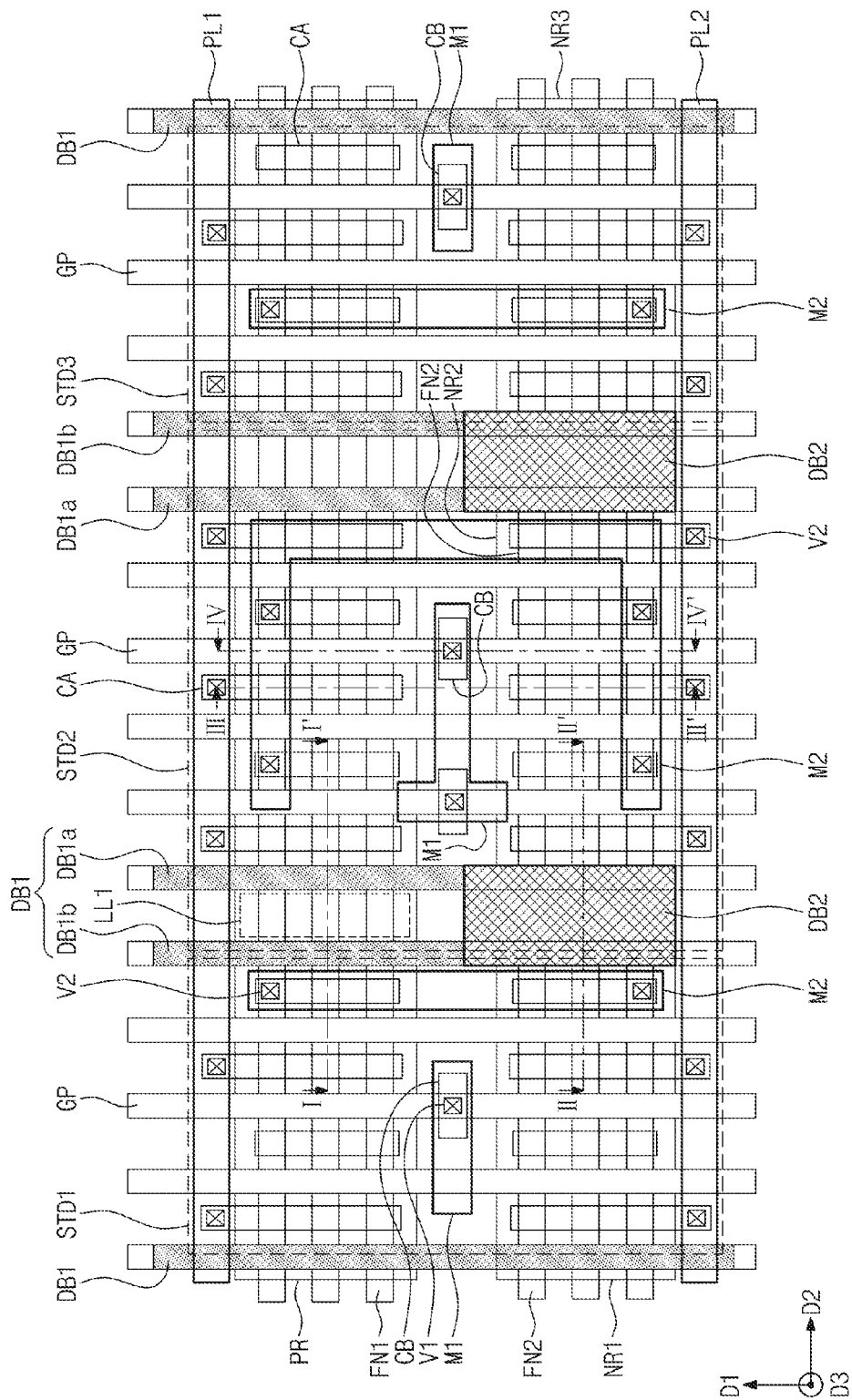
FIG. 5B is a plan view illustrating an arrangement of standard cell layouts redesigned according to an exemplary embodiment.
Figure 6A:
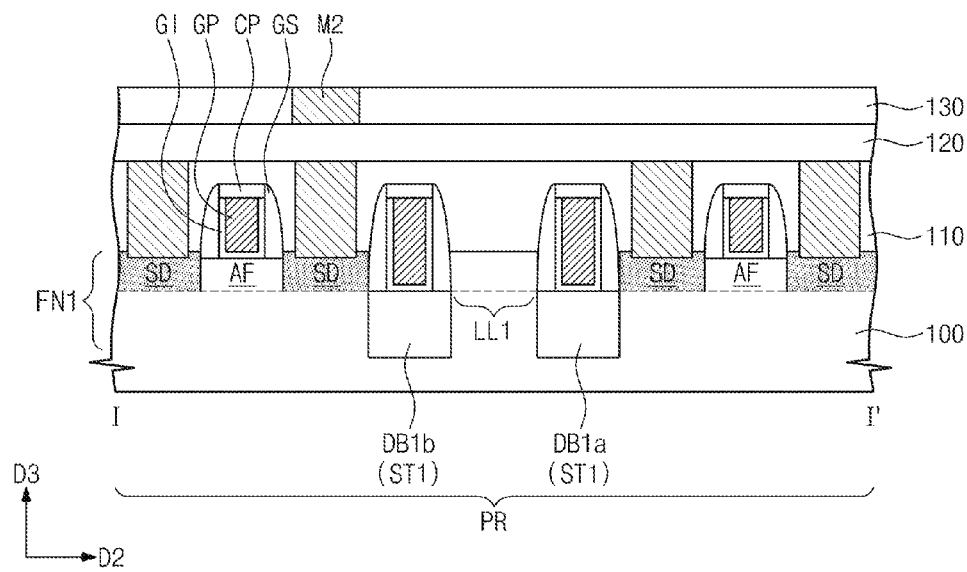
FIGS. 6A, 6B, 6C, and 6D are cross-sectional views corresponding to lines I-I', II-II', III-III', and IV-IV' of FIG. 5B, respectively, to illustrate a semiconductor device according to an example embodiment.
Figure 6B:
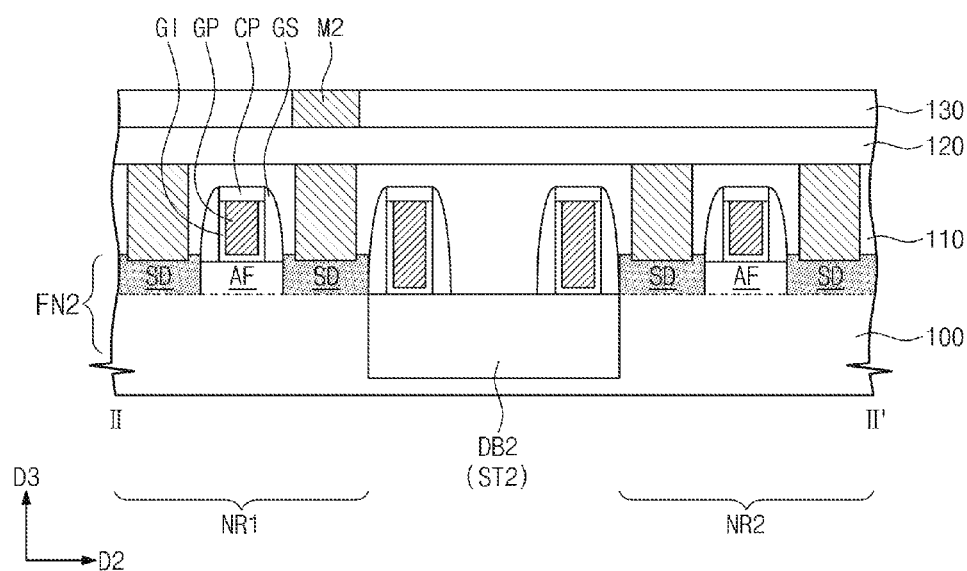
Figure 6C:
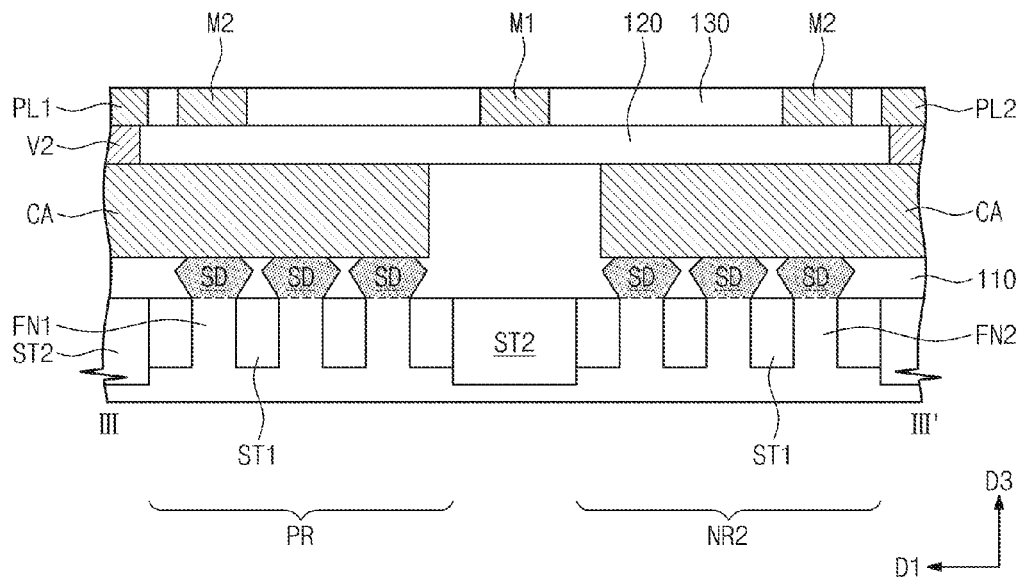
Figure 6D:
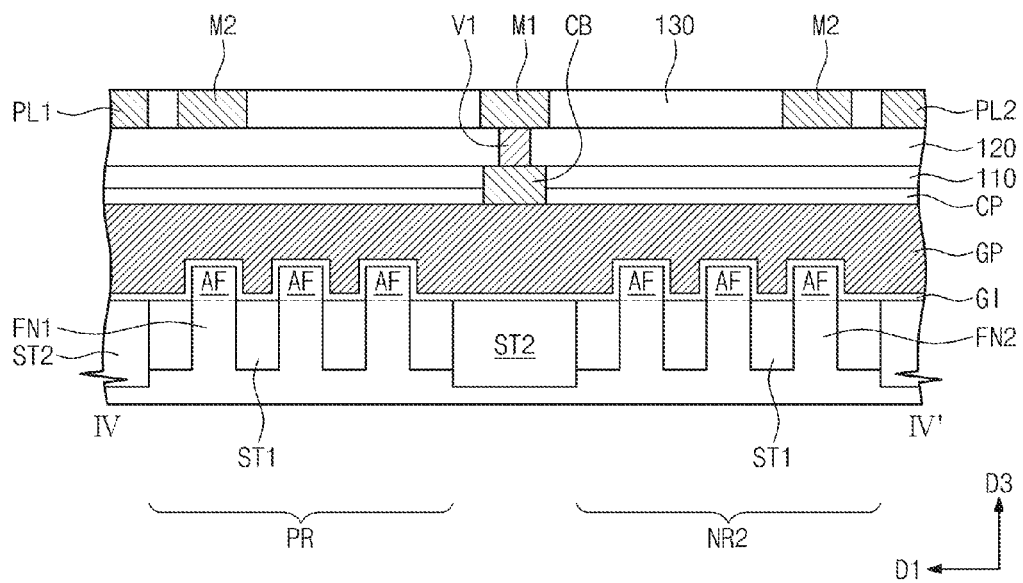

FIG. 4 is a flow chart illustrating a method of designing a layout of FIG. 3, according to example embodiments. FIG. 5A is a plan view illustrating a standard cell layout redesigned according to example embodiments. FIG. 5B is a plan view illustrating an arrangement of standard cell layouts redesigned according to example embodiments.

Referring to FIG. 4, a cell boundary characteristic of the second standard cell layout STD2 of FIG. 3 (i.e., original standard cell) is tested (S121). As described with reference to FIG. 3, the different influences may be applied to the electrical characteristic of a PMOS transistor and the electrical characteristic of an NMOS transistor, according to a kind of the diffusion barrier pattern disposed on the PMOSFET region PR and the NMOSFET region NR of the cell boundary.

The diffusion barrier pattern may be realized as an insulating layer provided in an upper portion of an active region of a substrate by processes of manufacturing a semiconductor device (S150 of FIG. 2). At this time, the PMOS transistor and NMOS transistor of a cell adjacent to the insulating layer may have different influences from each other on the basis of a width and a depth of the insulating layer. The diffusion barrier pattern may include a single diffusion barrier pattern DB1 defining a narrow and shallow insulating layer, and a double diffusion barrier pattern DB2 defining a wide and deep insulating layer.

Electrical characteristics of the PMOS and NMOS transistors were tested in a state in which the single diffusion barrier pattern DB1 or the double diffusion barrier pattern DB2 was disposed on each of the NMOSFET region PR and the second NMOSFET region NR at the boundary of the second standard cell layout STD2. The test results are shown in the following table 1.

TABLE 1

|  | TR | | CMOS | |
| --- | --- | --- | --- | --- |
|  | NMOS | PMOS | Speed | Area |
| Experimental example 1 | Single diffusion barrier pattern | Single diffusion barrier pattern | Normal | Excellent |
| Experimental example 2 | Double diffusion barrier pattern | Double diffusion barrier pattern | Normal | Bad |
| Experimental example 3 | Single diffusion barrier pattern | Double diffusion barrier pattern | Bad | Normal |
| Experimental example 4 | Double diffusion barrier pattern | Single diffusion barrier pattern | Excellent | Normal |

In the table 1, "Area" denotes an area of the standard cell. As illustrated in the table 1, the standard cell may have the smallest area when the single diffusion barrier patterns are applied to both the NMOS transistor and PMOS transistor, and the standard cell may have the greatest area when the double diffusion barrier patterns are applied to both the NMOS transistor and PMOS transistor. (see the experimental examples 1 and 2)

Referring to the table 1, in the case in which the double diffusion barrier pattern DB2 is disposed on the NMOSFET region NR and the single diffusion barrier pattern DB1 is disposed on the PMOSFET region PR (the experimental example 4), characteristics (i.e., speeds) of the PMOS and NMOS transistors may be much improved, as compared with other cases. In addition, the area of the standard cell of the experimental example 4 may be slightly greater than that of the standard cell of the experimental example 2.

Referring to FIGS. 4 and 5A, the second standard cell layout STD2 is redesigned to include a single diffusion barrier (SDB) pattern and/or a double diffusion barrier (DDB) pattern according to the test results (S122). The redesigned second standard cell layout STD2 may be additionally stored in the cell library.

Because the result of the experimental example 1 is excellent in the table 1, the single diffusion barrier pattern DB1 is disposed at the boundary of the PMOSFET region PR, and the double diffusion barrier pattern DB2 is disposed at the boundary of the NMOSFET region NR.

A width of the double diffusion barrier pattern DB2 may be greater than that of the single diffusion barrier pattern DB1. Thus, the single diffusion barrier pattern DB1 is provided in a pair. The pair of single diffusion barrier patterns DB1 includes a first single diffusion barrier pattern DB1a and a second single diffusion barrier pattern DB1b.

The first and second single diffusion barrier patterns DB1a and DB1b are aligned with the double diffusion barrier pattern DB2 in the first direction D1. In more detail, one sidewall of the double diffusion barrier pattern DB2 is aligned with one sidewall of the first single diffusion barrier pattern DB1a in the first direction D1, and another sidewall, opposite to the one sidewall, of the double diffusion barrier pattern DB2 is aligned with one sidewall of the second single diffusion barrier pattern DB1b in the first direction D1.

A first local area LL1 is defined in the PMOSFET region PR between the first and second single diffusion barrier patterns DB1a and DB1b. The first active patterns FN1 intersect the first local area LL1.

Referring to FIGS. 4 and 5B, first to third standard cell layouts STD1 to STD3 (i.e., standard cells) are placed along the second direction D2 by a layout design tool (S123). Unlike FIG. 3, the double diffusion barrier pattern DB2 and the first and second single diffusion barrier patterns DB1a and DB1b are disposed between the first and second standard cell layouts STD1 and STD2. In addition, the double diffusion barrier pattern DB2 and the first and second single diffusion barrier patterns DB1a and DB1b are also disposed between the second and third standard cell layouts STD2 and STD3.

The second standard cell layout STD2 may be a cell having a high-speed operation among the arranged cells. At this time, because the diffusion barrier patterns respectively suitable to the PMOS and NMOS transistors are disposed on the PMOSFET region PR and the NMOSFET region NR, a speed of the semiconductor device may be improved.

Thereafter, a process of routing the first to third standard cell layouts STD1 to STD3 is performed to being electrically connected with upper interconnections (S124). Additional interconnection layers and vias may be sequentially stacked on the first to third standard cell layouts STD1 to STD3. The standard cells may be connected to each other to meet a design by the routing process. The routing process may be automatically performed in consideration of connection relation of the standard cells by the layout design tool.

Unlike the example embodiments, kinds of diffusion barrier patterns respectively suitable to the PMOSFET region PR and the NMOSFET region NR may be changed according to a kind of the semiconductor device. In other words, according to the kind of the semiconductor device, a result of the experimental example 1, 2, or 3 may be better than that of the experimental example 4. As a result, cell boundary characteristics may be tested according to the kind of the semiconductor device, and thus the single diffusion barrier pattern DB1 and/or the double diffusion barrier pattern DB2 may be placed differently from the example embodiments.

FIGS. 6A, 6B, 6C, and 6D are cross-sectional views corresponding to lines I-I', II-II', III-III', and IV-IV' of FIG. 5B, respectively, to illustrate a semiconductor device according to example embodiments. In detail, FIGS. 6A to 6D illustrate example embodiments of the semiconductor device realized using the standard cell layouts described with reference to FIG. 5B.

In FIGS. 6A to 6D, elements of the semiconductor device corresponding to the standard cell layouts according to the aforementioned example embodiments will be indicated by the same reference numerals or the same reference designators. However, the elements of the semiconductor device may correspond to real patterns that are realized on a semiconductor substrate by photolithography processes using the standard cell layouts described above. Thus, the elements of the semiconductor device may not be the same as the patterns of the standard cell layouts described above. In example embodiments, the semiconductor device may be a system-on-chip (SoC).

Referring to FIGS. 5B and 6A to 6D, second device isolation layers ST2 are provided in a substrate 100 to define a PMOSFET region PR and an NMOSFET region NR. The second device isolation layers ST2 are formed in an upper portion of the substrate 100. For example, the substrate 100 may be a silicon substrate, a germanium substrate, or a silicon-on-insulator (SOI) substrate.

The PMOSFET region PR and the NMOSFET region NR are spaced apart from each other in a first direction D1 with the second device isolation layer ST2 interposed therebetween. The first direction D1 may be parallel to a top surface of the substrate 100. In example embodiments, each of the PMOSFET region PR and the NMOSFET region NR may be illustrated as a single region. Alternatively, each of the PMOSFET region PR and the NMOSFET region NR may include a plurality of regions separated from each other by the second device isolation layers ST2.

A plurality of first active patterns FN1 is provided on the PMOSFET region PR and extends in a second direction D2 intersecting the first direction D1. A plurality of second active patterns FN2 is provided on the NMOSFET region NR and extends in the second direction D2. The first and second active patterns FN1 and FN2 may correspond to portions of the substrate 100 and may protrude from the top surface of the substrate 100. The first and second active patterns FN1 and FN2 are arranged along the first direction D1. First device isolation layers ST1 extending in the second direction D2 are disposed at both sides of each of the first and second active patterns FN1 and FN2. In example embodiments, each of the first and second active patterns FN1 and FN2 may have a fin portion. The fin portion may have a fin-shape of which a top surface is higher than top surfaces of the first device isolation layers ST1.

The second device isolation layers ST2 and the first device isolation layers ST1 may be connected to each other to constitute an insulating layer of one body. Thicknesses (heights or depths) of the second device isolation layers ST2 may be greater than those of the first device isolation layers ST1. In this case, the first device isolation layers ST1 may be formed using a first process, and the second device isolation layers ST2 may be formed using a second process different from the first process. The first and second device isolation layers ST1 and ST2 may be formed in the upper portion of the substrate 100. For example, the first and second device isolation layers ST1 and ST2 may include a silicon oxide layer.

Gate electrodes GP are disposed on the first and second active patterns FN1 and FN2. The gate electrodes GP extend in the first direction D1 to intersect the first and second active patterns FN1 and FN2. The gate electrodes GP are spaced apart from each other in the second direction D2. Each of the gate electrodes GP extend in the first direction D1 to intersect the PMOSFET region PR, the second device isolation layer ST2, and the NMOSFET region NR.

A gate insulating pattern GI is provided under each of the gate electrodes GP, and gate spacers GS are provided on both sidewalls of each of the gate electrodes GP. A capping pattern CP is provided to cover a top surface of each of the gate electrodes GP. However, a portion of the capping pattern CP is removed, and thus, a gate contact CB is connected to a portion of the gate electrode GP. First, second, and third interlayer insulating layers 110, 120, and 130 are provided to cover the gate electrodes GP.

The gate electrodes GP may include at least one among a doped semiconductor, a metal, or a conductive metal nitride. The gate insulating pattern GI may include at least one among a silicon oxide layer, a silicon oxynitride layer, or a high-k dielectric layer having a higher dielectric constant than a silicon oxide layer. Each of the capping pattern CP and the gate spacer GS may include at least one among silicon oxide, silicon nitride, or silicon oxynitride. Each of the first to third interlayer insulating layers 110, 120, and 130 may include at least one among a silicon oxide layer or a silicon oxynitride layer.

Source/drain regions SD may be disposed in or on each of the first and second active patterns FN1 and FN2 at both sides of each of the gate electrodes GP. The source/drain regions SD of the PMOSFET region PR are P-type dopant regions, and the source/drain regions SD of the NMOSFET region NR are N-type dopant regions. The fin portions that are disposed under and overlap with each of the gate electrodes GP are used as channel regions AF.

In example embodiments, the source/drain regions SD may include epitaxial patterns formed by a selective epitaxial growth (SEG) process. In this case, top surfaces of the source/drain regions SD may be disposed at a higher level than the top surfaces of the fin portions. The source/drain regions SD may include a different semiconductor element from the substrate 100. For example, the source/drain regions SD may include a semiconductor element of which a lattice constant is greater or smaller than that of a semiconductor element of the substrate 100. Thus, the source/drain regions SD may provide compressive stress or tensile stress to the channel regions AF. In example embodiments, the source/drain regions SD may be formed using ion implantation processes.

The gate electrodes GP and the first and second active patterns FN1 and FN2 may constitute a plurality of logic transistors. In other word, the gate electrodes GP and the first and second active patterns FN1 and FN2 may correspond to the logic layout described with reference to FIG. 3.

Isolation structures may be disposed at a boundary between a first standard cell STD1 and a second standard cell STD2 and a boundary between the second standard cell STD2 and a third standard cell STD3, respectively. Each of the isolation structures includes a shallow isolation pattern DB1 and a deep isolation pattern DB2. The shallow isolation pattern DB1 includes first and second shallow isolation patterns DB1a and DB1b.

The first and second shallow isolation patterns DB1a and DB1b intersect the PMOSFET region PR and extend in the first direction D1. The deep isolation pattern DB2 intersects the NMOSFET region NR and extends in the first direction D1. The first and second shallow isolation patterns DB1a and DB1b are aligned with the deep isolation pattern DB2 in the first direction D1. One sidewall of the deep isolation pattern DB2 is aligned with one sidewall of the first shallow isolation pattern DB1a in the first direction D1 when viewed from a plan view. In addition, another sidewall, opposite to the one sidewall, of the deep isolation pattern DB2 is aligned with one sidewall of the second shallow isolation pattern DB1b in the first direction D1 when viewed from a plan view.

The shallow isolation pattern DB1 may be an insulating layer provided in an upper portion of the PMOSFET region PR and may have the substantially same thickness as the first device isolation layers ST1. Thus, the shallow isolation pattern DB1 and the first device isolation layers ST1 may be connected to each other to constitute an insulating layer of one body. The shallow isolation pattern DB1 may penetrate an upper portion of the first active pattern FN1, and thus the first active pattern FN1 disposed at one side of the shallow isolation pattern DB1 may be electrically isolated from the first active pattern FN1 disposed at another side of the shallow isolation pattern DB1.

A first local area LL1 is defined in the PMOSFET region PR between the first and second shallow isolation patterns DB1a and DB1b. The first local area LL1 may buffer an electrical influence of the standard cells STD1 to STD3 on each other. The first active patterns FN1 intersect the first local area LL1. In other word, the first and second shallow isolation patterns DB1a and DB1b may not physically completely isolate the PMOSFET regions PR of adjacent standard cells from each other.

The deep isolation pattern DB2 may be an insulating layer provided in an upper portion of the NMOSFET region NR and may have the substantially same thickness as the second device isolation layers ST2. Thus, the deep isolation pattern DB2 and the second device isolation layers ST2 may be connected to each other to constitute an insulating layer of one body. The deep isolation pattern DB2 physically divides the NMOSFET region NR into two parts. For example, one deep isolation pattern DB2 penetrates the NMOSFET region NR to divide the NMOSFET region NR into a first NMOSFET region NR1 and a second NMOSFET region NR2. In addition, another deep isolation pattern DB2 may penetrate the NMOSFET region NR to divide the NMOSFET region NR into the second NMOSFET region NR2 and a third NMOSFET region NR3.

Because a width and a depth of the deep isolation pattern DB2 are greater than those of the shallow isolation pattern DB1, the deep isolation patterns DB2 may effectively insulate the NMOSFET regions NR1, NR2, and NR3 from each other. In other word, the deep isolation pattern DB2 may increase a breakdown voltage between the source/drain regions SD respectively disposed at both sides of the deep isolation pattern DB2.

In example embodiments, one gate electrode GP disposed on the first or second shallow isolation pattern DB1a or DB1b may extend in the first direction D1 to also be disposed on the deep isolation pattern DB2. In addition, two gate electrodes GP extending in the second direction D1 may be disposed on the deep isolation pattern DB2.

Source/drain contacts CA are provided between the gate electrodes GP. The source/drain contacts CA are arranged in the second direction D2 along the first and second active patterns FN1 and FN2. In example embodiments, the source/drain contacts CA are respectively disposed on the PMOSFET region PR and the NMOSFET region NR to be arranged in the first direction D1 between the gate electrodes GP, as illustrated in FIG. 5B. The source/drain contacts CA may be connected directly to the source/drain regions SD and may be electrically connected to the source/drain regions SD. The source/drain contacts CA may be provided in the first interlayer insulating layer 110.

Gate contacts CB are provided on the gate electrodes GP. The gate contacts CB are provided between the PMOSFET region PR and the NMOSFET region NR when viewed from a plan view. The gate contacts CB is provided in the first interlayer insulating layer 110.

First and second vias V1 and V2 may be provided in the second interlayer insulating layer 120 disposed on the first interlayer insulating layer 110. A first metal layer is provided in the third interlayer insulating layer 130 disposed on the second interlayer insulating layer 120. The first metal layer includes first and second power interconnections PL1 and PL2 and first and second metal interconnections M1 and M2.

In example embodiments, the first metal interconnection M1 is electrically connected to the gate contact CB through the first via V1. The second metal interconnection M2 is electrically connected to at least one source/drain contact CA through the second via V2.

The first power interconnection PL1 is disposed at a side of the PMOSFET region PR when viewed from a plan view, and the second power interconnection PL2 is disposed at a side of the NMOSFET region NR when viewed from a plan view. In example embodiments, the PMOSFET region PR and the NMOSFET region NR are disposed between the first power interconnection PL1 and the second power interconnection PL2 when viewed from a plan view. The first power interconnection PL1 is electrically connected to the source/drain contact CA of the PMOSFET region PR through the second via V2, and thus a drain voltage (Vdd, i.e., a power voltage) may be applied to some of the source/drain regions SD of the PMOSFET region PR through the first power interconnection PL1. The second power interconnection PL2 is electrically connected to the source/drain contact CA of the NMOSFET region NR through the second via V2, and thus a source voltage (Vss, i.e., a ground voltage) may be applied to some of the source/drain regions SD of the NMOSFET region NR through the second power interconnection PL2.

Figure 7A:
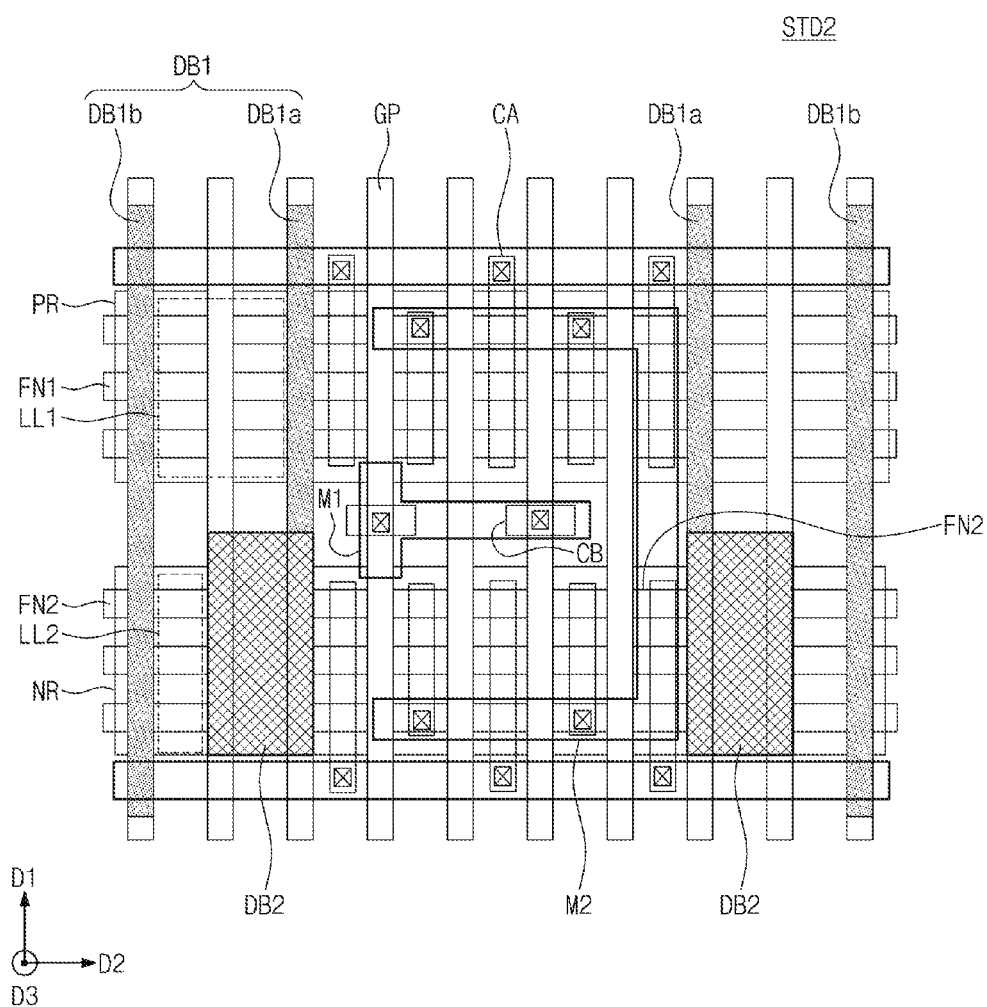
FIG. 7A is a plan view illustrating a standard cell layout redesigned according to an example embodiment.
Figure 7B:
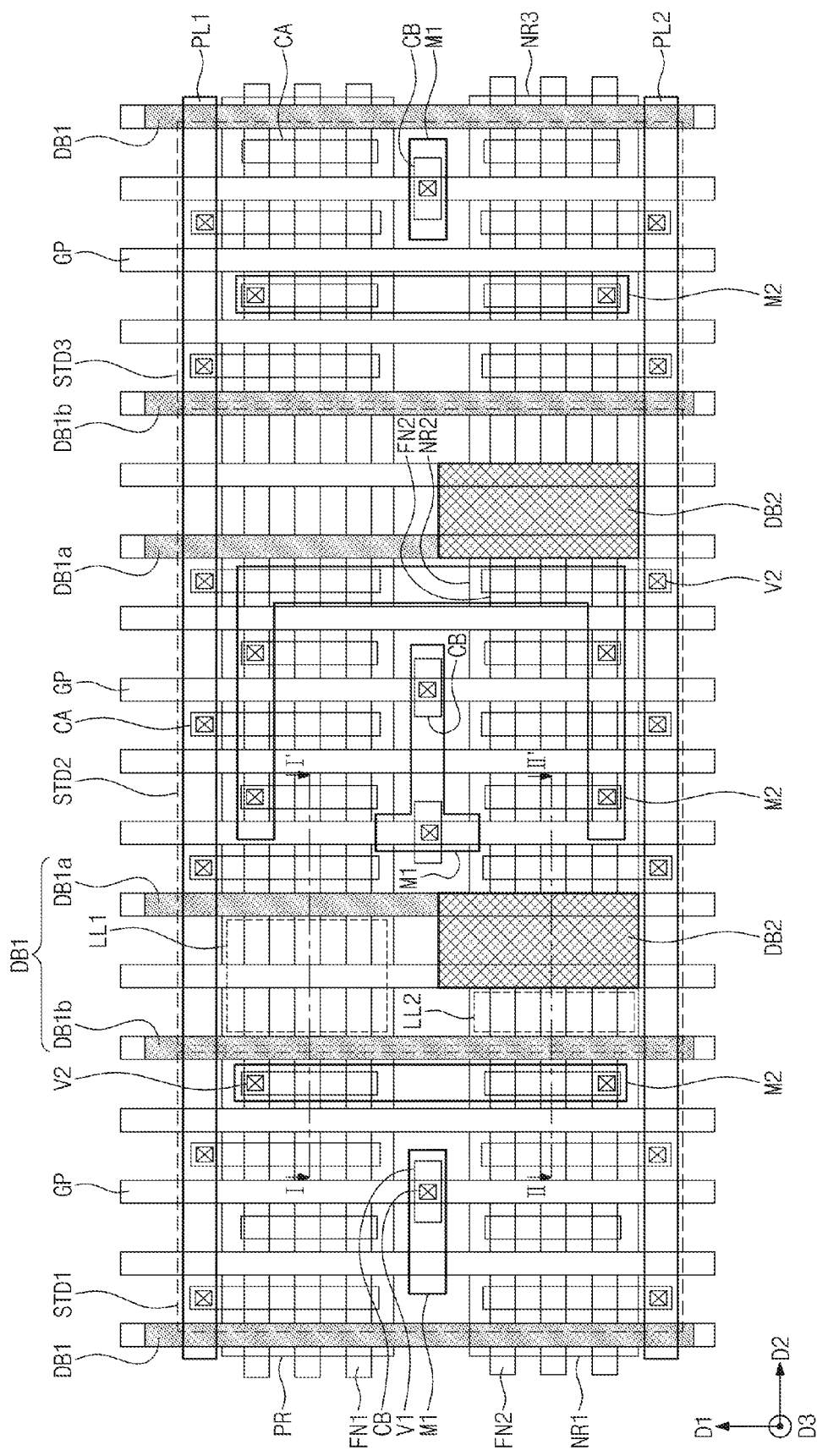
FIG. 7B is a plan view illustrating an arrangement of standard cell layouts redesigned according to an example embodiment.

FIG. 7A is a plan view illustrating a standard cell layout redesigned according to example embodiments. FIG. 7B is a plan view illustrating an arrangement of standard cell layouts redesigned according to example embodiments. In the example embodiments, the descriptions to the same technical features as in the example embodiments of FIGS. 5A and 5B will be omitted or mentioned briefly for the purpose of ease and convenience in explanation. In other words, differences between the example embodiments of FIGS. 7A and 7B and the example embodiments of FIGS. 5A and 5B will be mainly described hereinafter.

Referring to FIGS. 4 and 7A, a second standard cell layout STD2 may be redesigned according to the test results described with reference to FIG. 4 and the table 1 (S122). The redesigned second standard cell layout STD2 may be additionally stored in a cell library.

In detail, according to the experimental example 4 of the table 1, a single diffusion barrier pattern DB1 is disposed at the boundary of the PMOSFET region PR, and a double diffusion barrier pattern DB2 is disposed at the boundary of the NMOSFET region NR.

The single diffusion barrier pattern DB1 is provided in a pair. The pair of single diffusion barrier patterns DB1 includes a first single diffusion barrier pattern DB1a and a second single diffusion barrier pattern DB1b. The first single diffusion barrier patterns DB1a is aligned with the double diffusion barrier pattern DB2 in the first direction D1. In other word, one sidewall of the double diffusion barrier pattern DB2 is aligned with one sidewall of the first single diffusion barrier pattern DB1a in the first direction D1.

The second single diffusion barrier pattern DB1b is spaced apart from the double diffusion barrier pattern DB2 in the second direction D2. The second diffusion barrier pattern DB1b extends in the first direction D1 to intersect both the PMOSFET region PR and the NMOSFET region NR.

A first local area LL1 is defined in the PMOSFET region PR between the first and second single diffusion barrier patterns DB1a and DB1b. An area of the first local area LL1 according to the example embodiments may be wider than that of the first local area LL1 described with reference to FIG. 5A. Thus, at least one gate pattern GP intersects the first local area LL1 and extends onto the double diffusion barrier patterns DB2. In addition, the first active patterns FN1 intersect the at least one gate pattern GP and the first local area LL1.

A second local area LL2 is defined in the NMOSFET region NR between the second single diffusion barrier pattern DB1b and the double diffusion barrier pattern DB2. The second active patterns FN2 intersect the second local area LL2.

Referring to FIGS. 4 and 7B, first to third standard cell layouts STD1, STD2, and STD3 are arranged along the second direction D2 by a layout design tool (S123). Similarly to the example embodiments of FIG. 3, the second single diffusion barrier patterns DB1b is disposed between the first and second standard cell layouts STD1 and STD2 and between the second and third standard cell layouts STD2 and STD3, respectively. Similarly to the example embodiments of FIG. 5B, the first single diffusion barrier pattern DB1a and the double diffusion barrier pattern DB2 are additionally disposed.

Unlike the example embodiments of FIG. 5B, the first local area LL1 and the second local area LL2 are at each of the boundaries between the standard cells. The first local area LL1 may buffer an electrical influence of the PMOS transistors of adjacent standard cells upon each other, and the second local area LL2 may buffer an electrical influence of the NMOS transistors of the adjacent standard cells upon each other. Thus, electrical characteristics of the semiconductor device may be improved.

Thereafter, the process of routing the first to third standard cell layouts STD1 to STD3 using upper interconnections may be performed (S124).

Figure 8A:
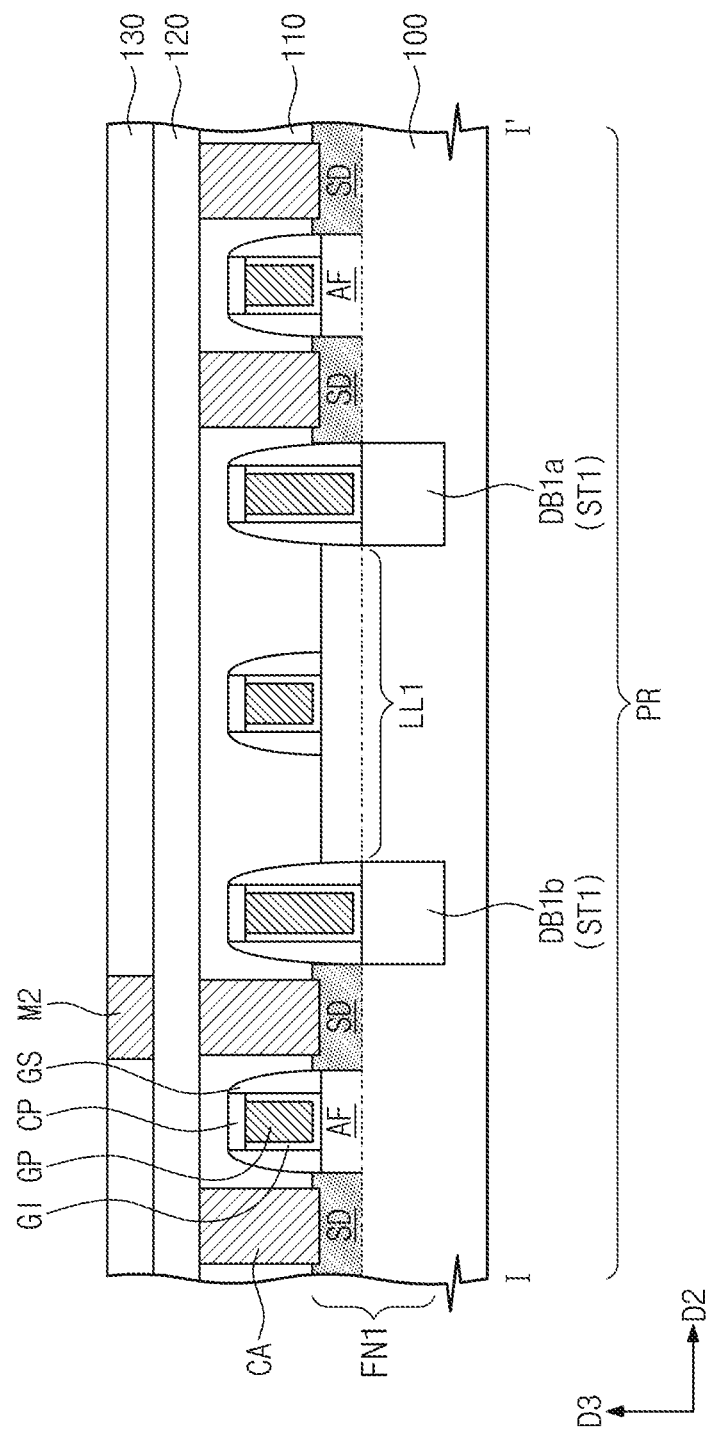
FIGS. 8A and 8B are cross-sectional views corresponding to lines I-I' and II-II' of FIG. 7B, respectively, to illustrate a semiconductor device according to an example embodiment.
Figure 8B:
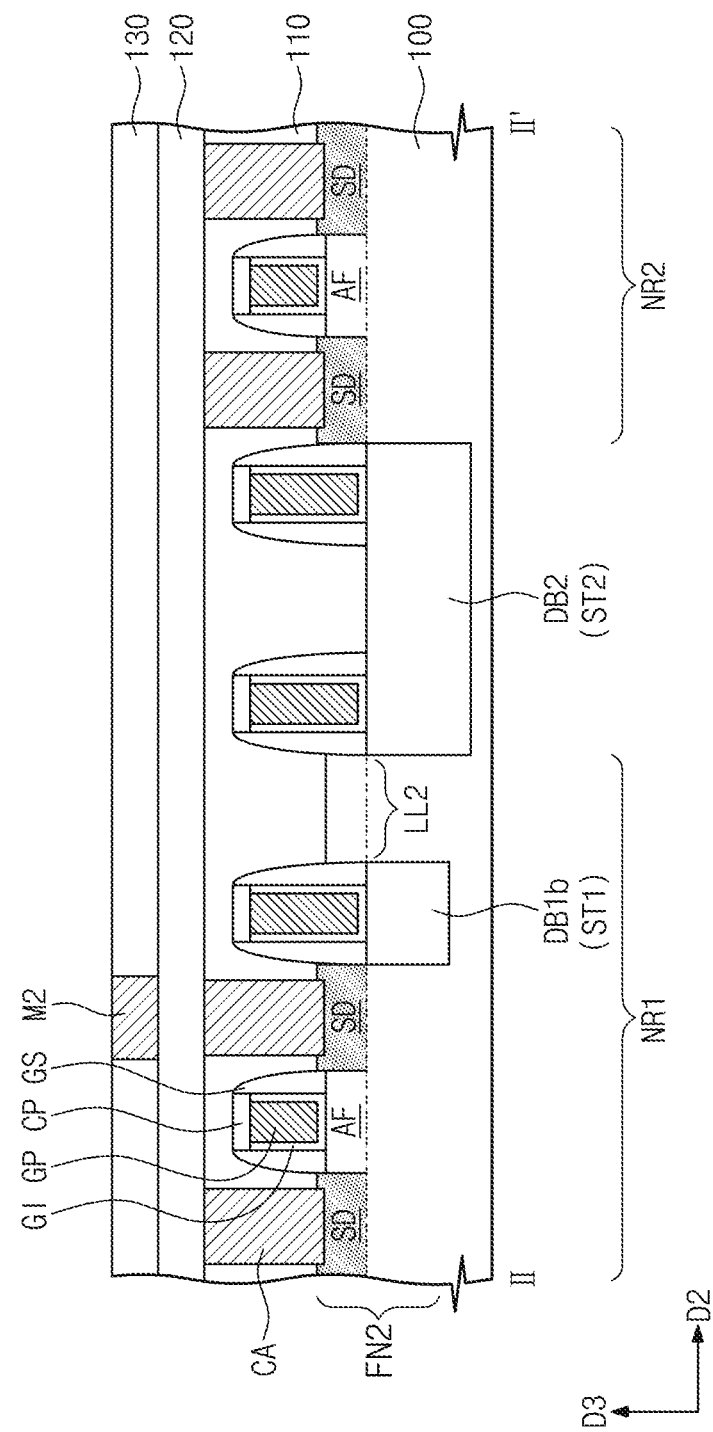

FIGS. 8A and 8B are cross-sectional views corresponding to lines I-I' and II-II' of FIG. 7B, respectively, to illustrate a semiconductor device according to example embodiments. In detail, FIGS. 8A and 8B illustrate example embodiments of the semiconductor device realized using the standard cell layouts described with reference to FIG. 7B. In the example embodiments, the descriptions to the same technical features as in the example embodiments of FIGS. 6A to 6D will be omitted or mentioned briefly for the purpose of ease and convenience in explanation. In other words, differences between the example embodiments of FIGS. 8A and 8B and the example embodiments of FIGS. 6A to 6D will be mainly described hereinafter.

Referring to FIGS. 7B, 8A, and 8B, isolation structures are disposed at the boundary between the first standard cell STD1 and the second standard cell STD2 and the boundary between the second standard cell STD2 and the third standard cell STD3, respectively. Each of the isolation structures includes a shallow isolation pattern DB1 and a deep isolation pattern DB2. The shallow isolation pattern DB1 includes first and second shallow isolation patterns DB1a and DB1b.

The first shallow isolation pattern DB1a intersects the PMOSFET region PR and extends in the first direction D1. The deep isolation pattern DB2 intersects the NMOSFET region NR and extends in the first direction D1. One sidewall of the deep isolation pattern DB2 is aligned with one sidewall of the first shallow isolation pattern DB1a in the first direction D1 when viewed from a plan view. Meanwhile, the second shallow isolation pattern DB1b is spaced apart from the deep isolation pattern DB2 in the second direction D2 and extends in the first direction D1 to intersect both the PMOSFET region PR and the NMOSFET region NR.

A first local area LL1 is defined in the PMOSFET region PR between the first and second shallow isolation patterns DB1a and DB1b. The first active patterns FN1 intersect the first local area LL1. In addition, at least one gate electrode GP intersects the first active patterns FN1 and the first local area LL1 and extends onto the deep isolation pattern DB2.

A second local area LL2 is defined in the first NMOSFET region NR1 between the second shallow isolation pattern DB1b and the deep isolation pattern DB2. The second active patterns FN2 intersect the second local area LL2.

Figure 9A:
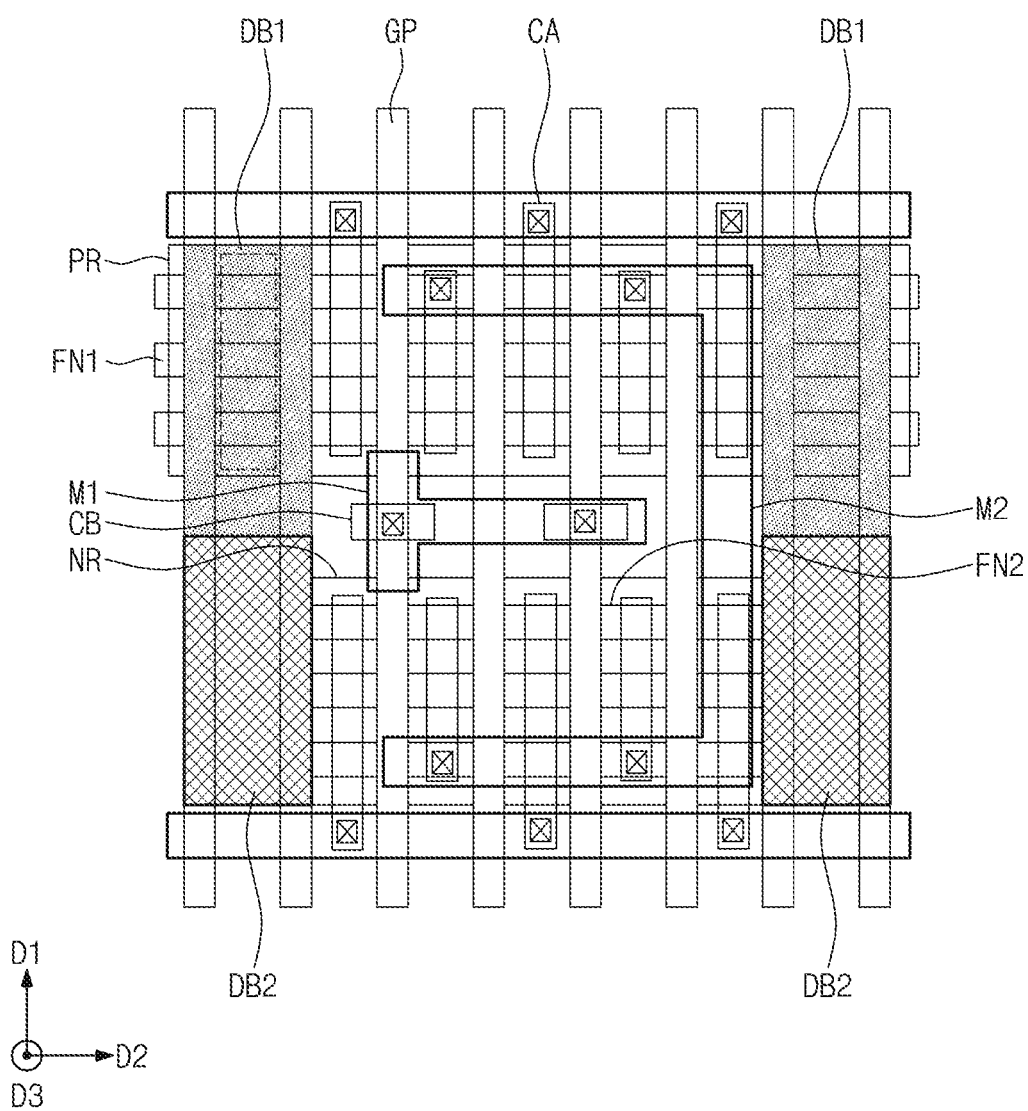
FIG. 9A is a plan view illustrating a standard cell layout redesigned according to an example embodiment.
Figure 9B:
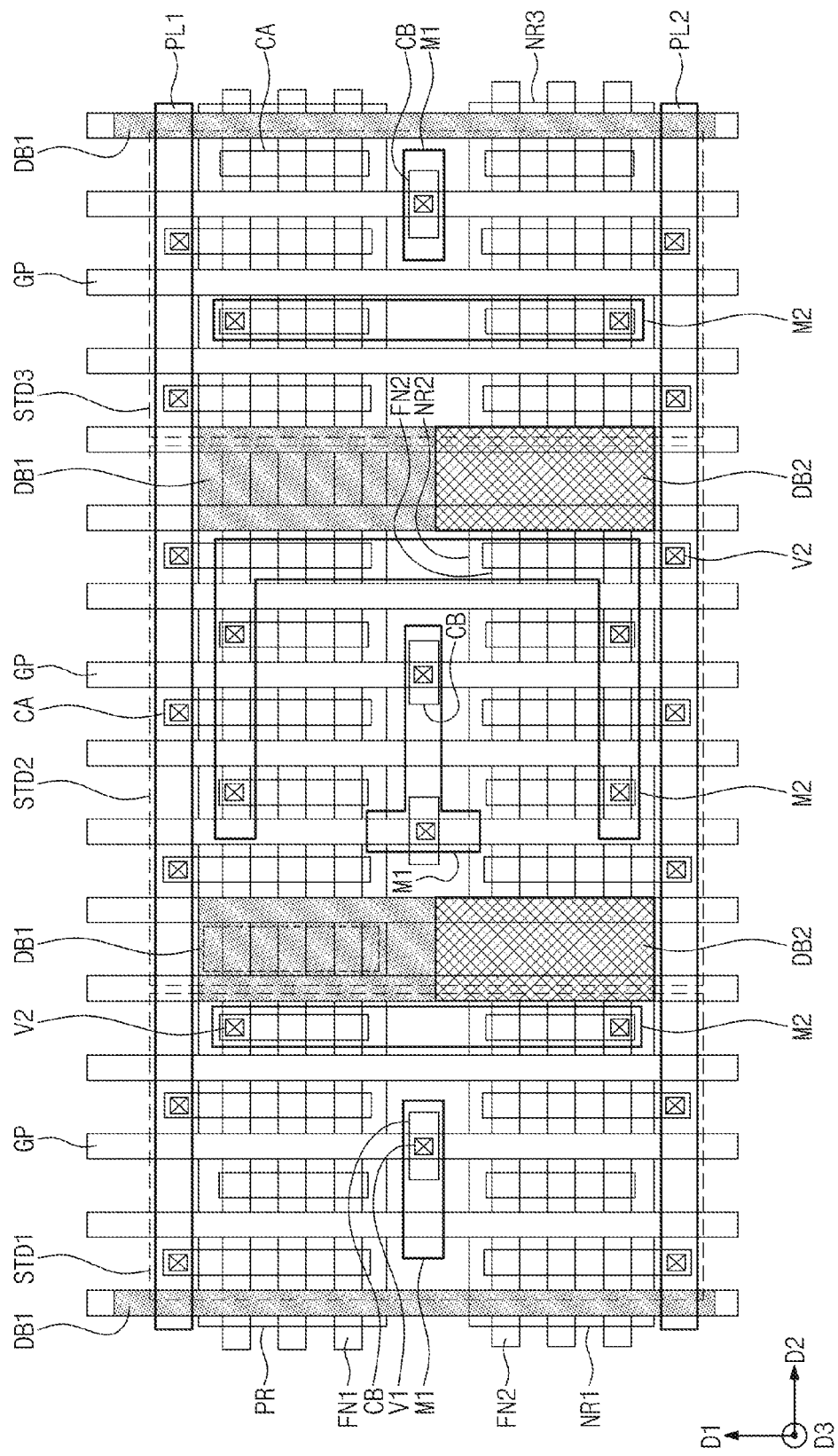
FIG. 9B is a plan view illustrating an arrangement of standard cell layouts redesigned according to an example embodiment.

FIG. 9A is a plan view illustrating a standard cell layout redesigned according to example embodiments. FIG. 9B is a plan view illustrating an arrangement of standard cell layouts redesigned according to example embodiments. In the example embodiments, the descriptions to the same technical features as in the example embodiments of FIGS. 5A and 5B will be omitted or mentioned briefly for the purpose of ease and convenience in explanation. In other words, differences between the example embodiments of FIGS. 9A and 9B and the example embodiments of FIGS. 5A and 5B will be mainly described hereinafter.

Referring to FIGS. 4 and 9A, a second standard cell layout STD2 may be redesigned (S122). A single diffusion barrier pattern DB1 is disposed at the boundary of the PMOSFET region PR. Unlike the second standard cell layout STD2 of FIG. 5A, both sidewalls of the single diffusion barrier pattern DB1 are respectively aligned with both sidewalls of the double diffusion barrier pattern DB2 disposed at the boundary of the NMOSFET region NR in the first direction D1. In other word, a width of the single diffusion barrier pattern DB1 may be substantially equal to that of the double diffusion barrier pattern DB2.

The single diffusion barrier pattern DB1 of FIG. 9A may define a region in which a shallow isolation pattern will be formed. Thus, the single diffusion barrier pattern DB1 of FIG. 9A may perform the substantially same function as the first and second single diffusion barrier patterns DB1a and DB1b described with reference to FIG. 5A in terms of a layout design. The first and second single diffusion barrier patterns DB1a and DB1b may have a different shape from the first and second single diffusion barrier patterns DB1a and DB1b of FIG. 5A, although they are functionally equal to each other. As a result, when a semiconductor device is realized using the second standard cell layout STD2 of FIG. 9A, the shallow isolation pattern may be formed under gate patterns GP overlapping with the single diffusion barrier pattern DB1.

Referring to FIGS. 4 and 9B, first to third standard cell layouts STD1, STD2, and STD3 are arranged along the second direction D2 by a layout design tool (S123). Unlike the example embodiments of FIG. 5B, the double diffusion barrier pattern DB2 and the single diffusion barrier pattern DB1 having the substantially same width as the double diffusion barrier pattern DB2 are disposed between the first and second standard cell layouts STD1 and STD2. In addition, the double diffusion barrier pattern DB2 and the single diffusion barrier pattern DB1 having the substantially same width as the double diffusion barrier pattern DB2 are also disposed between the second and third standard cell layouts STD2 and STD3.

Meanwhile, the semiconductor device realized using the layout of FIG. 9B may be the substantially same as the semiconductor device described with reference to FIGS. 6A to 6D. This may be because the single diffusion barrier pattern DB1 of FIG. 9 may perform the substantially same function as the first and second single diffusion barrier patterns DB1a and DB1b of FIG. 5B.

In the semiconductor device according to example embodiments, the shallow isolation pattern and/or the deep isolation pattern may be suitably disposed at the boundary of the PMOSFET region and the boundary of the NMOSFET region, thereby improving the electrical characteristics of the semiconductor device.

Although a few example embodiments have been shown and described, it would be appreciated by those skilled in the art that changes may be made in the example embodiments without departing from the principles and spirit of the disclosure, the scope of which is defined in the claims and their equivalents.

What is claimed is:

1. A semiconductor device comprising:
   a substrate comprising a first active region and a second active region, the first active region having a first conductivity type that is different than a second conductivity type of the second active region, and the first active region being spaced apart from the second active region in a first direction;
   gate electrodes extending in the first direction and intersecting the first active region and the second active region;
   a first shallow isolation pattern provided in a first upper portion of the first active region, the first shallow isolation pattern extending in the first direction;
   a deep isolation pattern provided in a second upper portion of the second active region, the deep isolation pattern extending in the first direction and dividing the second active region into a first section and a second section,
   wherein the first shallow isolation pattern is aligned with the deep isolation pattern in the first direction, and
   each of the gate electrodes is disposed on and aligned with either one or both of the first shallow isolation pattern and the deep isolation pattern, in the first direction; and
   a second shallow isolation pattern disposed in the first upper portion of the first active region, the second shallow isolation pattern extending in the first direction,
   wherein a first sidewall of the first shallow isolation pattern is aligned with a second sidewall of the deep isolation pattern in the first direction,
   a third sidewall of the second shallow isolation pattern is aligned with a fourth sidewall of the deep isolation pattern in the first direction,
   the first active region comprises a first local area provided between the first shallow isolation pattern and the second shallow isolation pattern, and
   the first active region intersects the first local area.

2. The semiconductor device of claim 1, further comprising:
   first active patterns disposed on the substrate in the first active region, the first active patterns extending in a second direction intersecting the first direction; and
   second active patterns disposed on the substrate in the second active region, the second active patterns extending in the second direction.

3. The semiconductor device of claim 1, wherein the second shallow isolation pattern is further disposed in a third upper portion of the first section of the second active region, and
   the first section of the second active region comprises a second local area disposed between the second shallow isolation pattern and the deep isolation pattern.

4. The semiconductor device of claim 3, wherein at least one gate electrode among the gate electrodes intersects the first local area and a top surface of the deep isolation pattern.

5. The semiconductor device of claim 1, wherein a first width of the deep isolation pattern is greater than a second width of the first shallow isolation pattern, and
   a first depth of the deep isolation pattern is deeper than a second depth of the first shallow isolation pattern.

6. The semiconductor device of claim 1, wherein the first shallow isolation pattern and the deep isolation pattern are disposed at a boundary between a first standard cell and a second standard cell adjacent to the first standard cell to isolate the first standard cell from the second standard cell.

7. The semiconductor device of claim 1, wherein at least two of the gate electrodes intersect a top surface of the deep isolation pattern.

8. A semiconductor device comprising:
   a substrate;
   first active patterns disposed on the substrate, the first active patterns extending in a first direction;
   second active patterns disposed on the substrate, the second active patterns extending in the first direction in parallel to the first active patterns, and the first active patterns having a first conductivity type that is different than a second conductivity type of the second active patterns;
   device isolation layers disposed between the first active patterns adjacent to each other in a second direction intersecting the first direction, and disposed between the second active patterns adjacent to each other in the second direction, the device isolation layers extending in the first direction;
   gate electrodes intersecting the first active patterns and the second active patterns, the gate electrodes extending in the second direction; and
   an isolation structure disposed at a boundary between a first standard cell and a second standard cell adjacent to the first standard cell, the isolation structure isolating the first standard cell from the second standard cell,
   wherein the isolation structure comprises:
   a first shallow isolation pattern disposed between the first active patterns adjacent to each other in the first direction;
   a deep isolation pattern disposed between the second active patterns adjacent to each other in the first direction,
   wherein the first shallow isolation pattern and the deep isolation pattern extends in the second direction; and
   a second shallow isolation pattern provided between the first active patterns,
   wherein a first sidewall of the first shallow isolation pattern is aligned with a second sidewall of the deep isolation pattern in the second direction, and
   a third sidewall of the second shallow isolation pattern is aligned with a fourth sidewall of the deep isolation pattern in the second direction,
   the substrate comprises a first local area provided between the first shallow isolation pattern and the second shallow isolation pattern, and
   the first active patterns intersect the first local area.

9. The semiconductor device of claim 8, wherein one gate electrode among the gate electrodes is disposed on the first shallow isolation pattern and the deep isolation pattern.

10. The semiconductor device of claim 8, wherein second shallow isolation pattern is provided between the first active patterns and the second active patterns, the second shallow isolation pattern being spaced apart from the deep isolation pattern in the first direction.

11. The semiconductor device of claim 10, wherein the substrate further comprises a second local area provided between the second shallow isolation pattern and the deep isolation pattern, and the second active patterns intersect the second local area.

12. A semiconductor device comprising:
a substrate;
first active patterns disposed on the substrate, the first active patterns extending in a first direction;
second active patterns disposed on the substrate, the second active patterns extending in the first direction, and the first active patterns having a first conductivity type that is different than a second conductivity type of the second active patterns;
a first isolation pattern disposed in the substrate and between the first active patterns, the first isolation pattern extending in a second direction intersecting the first direction;
a second isolation pattern disposed in the substrate and between the second active patterns, the second isolation pattern extending in the second direction, and the first isolation pattern having a first depth and a first width that are less than a second depth and a second width of the second isolation pattern;
a first gate electrode disposed on the first isolation pattern and the second isolation pattern, the first gate electrode extending in the second direction, and the first gate electrode being aligned with, in the second direction, the first isolation pattern and the second isolation pattern; and
a second gate electrode disposed on the first active patterns and the second active patterns, the second gate electrode extending in the second direction, and the second gate electrode being disposed on and aligned with, in the second direction, either one or both of the first isolation pattern and the second isolation pattern,
wherein the first isolation pattern comprises a first portion comprising a first sidewall aligned with a second sidewall of the second isolation pattern, and a second portion comprising a third sidewall aligned with a fourth sidewall of the second isolation pattern, and
the substrate comprises a first local area disposed between the first portion and the second portion, the first local area being on which the first active patterns are disposed.

13. The semiconductor device of claim 12, wherein the second portion is disposed between the first active patterns and the second active patterns,
the substrate further comprises a second local area disposed between the second portion and the second isolation pattern, the first local area being on which the first active patterns and the second gate electrode are disposed, and the second local area being on which the second active patterns are disposed, and
the second gate electrode is extending from the first local area to the second isolation pattern in the second direction.

* * * * *